United States Patent [19]
Kuroda

[11] Patent Number: 6,005,265
[45] Date of Patent: *Dec. 21, 1999

[54] SEMICONDUCTOR INTEGRATED CIRCUIT DEVICE HAVING WIRING LAYOUT FOR SMALL AMPLITUDE SIGNALS

[75] Inventor: Tadahiro Kuroda, Yokohama, Japan

[73] Assignee: Kabushiki Kaisha Toshiba, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/939,869

[22] Filed: Sep. 29, 1997

[30] Foreign Application Priority Data

Sep. 30, 1996 [JP] Japan .................................. 8-259480

[51] Int. Cl.$^6$ ........................... H01L 27/10; H01L 23/58; H01L 23/62; H01L 23/48
[52] U.S. Cl. .......................... 257/208; 257/210; 257/211; 257/665; 257/776
[58] Field of Search ..................................... 257/208, 210, 257/211, 665, 776

[56] References Cited

U.S. PATENT DOCUMENTS

| | | | |
|---|---|---|---|
| 5,534,732 | 7/1996 | DeBrosse et al. | 257/776 |
| 5,625,234 | 4/1997 | Suzuki et al. | 257/773 |

*Primary Examiner*—Ngân V. Ngô
*Attorney, Agent, or Firm*—Loeb & Loeb LLP

[57] ABSTRACT

A semiconductor integrated circuit device capable of reducing delay of wiring as far as possible is provided. The semiconductor integrated circuit device comprises at least two sets of pairs of signal lines having first polarity and second polarity opposite thereto, wherein the signal line of the first polarity of the signal lines of the second set is disposed at the portion adjacent to the signal line of the first polarity of the signal lines of the first set, the signal line of the second polarity of the first set is disposed at the portion adjacent to the signal line of the first polarity of the second set, and the signal line of the second polarity of the second set is disposed at the portion adjacent to the signal line of the second polarity of the first set.

18 Claims, 4 Drawing Sheets

SEMICONDUCTOR INTEGRATED CIRCUIT DEVICE HAVING WIRING LAYOUT FOR SMALL AMPLITUDE SIGNALS

FIELD OF THE INVENTION

This invention relates to a semiconductor integrated circuit device, and more particularly to a semiconductor integrated circuit device used for layout of differential signal wiring or complementary signal wiring.

PRIOR ART

Generally, differential signals are suitable for the transmission of small amplitude signals because they are tolerable to common-mode noise. In order to allow long wiring (e.g., bus) to which the proportional reduction rule cannot be applied to have high speed and low power features, it is effective to receive or transmit signals by small amplitude. In that case, it is desirable to allow such signals to be differential signals so that they are tolerable to noise.

On the other hand, complementary signals are used in various circuits. For example, they are, e.g., partially decoded signals of the decoder circuit of memory, signals of the complementary pass transistor circuit, and signals of the two-wire type asynchronous circuit, etc.

Meanwhile, when miniaturization is implemented, the wiring delay time is not so reduced as compared to the circuit delay time of gate, etc. In future, it is considered that the wiring delay will be one of the significant factors which determine the performance of the chip. Further, followed by miniaturization, crosstalk noise resulting from capacitive coupling with left and right signal lines increases. As a result, the signal propagation time is caused to undergo interference with the left and right signal lines so that it becomes uneven. Thus, since it is impossible to correctly grasp the arrival time of the signal, it becomes difficult to make a design so as to satisfy the conditions of the set-up time and/or the hold time of latch at the succeeding stage.

Suppose, as an example, transmission of differential (or complementary) signal of 4 bits using wiring having length of 15 mm, width of 0.4 um and interval of 0.4 $\mu$m. In this case, resistance value R of wiring is about 2 k$\Omega$, and ground capacitance Cv and capacitance Ch between left and right wirings are both about 1 pF. In the following description, it is assumed for the brevity that R=2 k$\Omega$, and Cv=Ch=C=1 pF.

Figure 8:
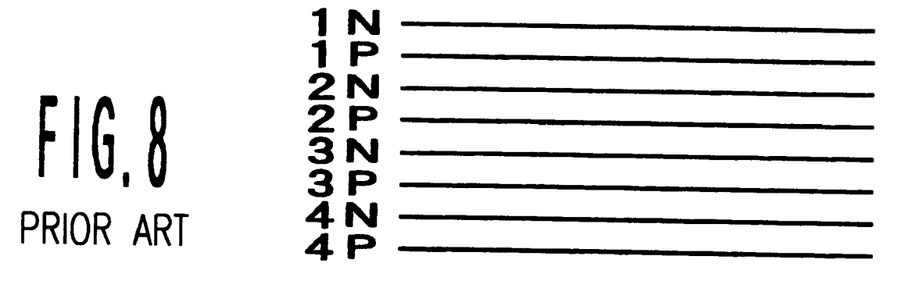
FIG. 8 is a view showing conventional wiring layout.

Hitherto, the signal wiring was caused to undergo layout as shown in FIG. 8. This layout is represented as below.

Wiring layout {1N, 1P, 2N, 2P, 3N, 3P, 4N, 4P}. For example, 1P represents non-inverted signal wiring of the first bit and 1N represents inverted signal wiring of the first bit. Moreover, e.g., the signal of the first bit is represented by d1. In addition, the status where signal shifts from low level to high level is represented by +1, the status where signal shifts from high level to low level is represented by −1, and the status where no signal transition takes place (unchanged in the state remaining to be at high level or low level) is represented by 0 (zero).

When the state (d2=+1) where signal of the second bit shifts from low level to high level is supposed and all combinations of signal transitions of the first bit signal (d1) and the third bit signal (d3) adjacent in left and right directions are supposed, calculated results of equivalent capacitance values (C2N and C2P) of the second bit lines (2N and 2P), single end signal propagation delay times ($\tau$2N and $\tau$2P) and differential signal propagation delay time ($\tau$ differential) in the case where the transition states of signals on respective signal lines and capacitive coupling with left and right wirings are taken into consideration are shown in Table 1.

TABLE 1

Case of Wiring Layout {1N 1P 2N 2P 3N 3P 4N 4P}

| Adjacent Signal | | Wiring Signal at Time of Layout | | | | | Capacitance (C conversion) | | Delay Time (RC Conversion) | | |
|---|---|---|---|---|---|---|---|---|---|---|---|
| d1 | d3 | 1N | 1P | 2N | 2P | 3N | C2N | C2P | $\tau$ 2N | $\tau$ 2P | $\tau$ Differential |
| +1 | +1 | −1 | +1 | −1 | +1 | −1 | 5 | 5 | 5.00 | 5.00 | 5.00 |
| +1 | 0  | −1 | +1 | −1 | +1 | 0  | 5 | 4 | 5.00 | 4.00 | 4.40 |
| +1 | −1 | −1 | +1 | −1 | +1 | +1 | 5 | 3 | 5.00 | 3.00 | 3.80 |
| 0  | +1 | 0  | 0  | −1 | +1 |    | 4 | 5 | 4.00 | 5.00 | 4.40 |
| 0  | 0  | 0  | 0  | −1 | +1 | 0  | 4 | 4 | 4.00 | 4.00 | 4.00 |
| 0  | −1 | 0  | 0  | −1 | +1 | +1 | 4 | 3 | 4.00 | 3.00 | 3.40 |
| −1 | +1 | +1 | −1 | −1 | +1 | −1 | 3 | 5 | 3.00 | 5.00 | 3.80 |
| −1 | 0  | +1 | −1 | −1 | +1 | 0  | 3 | 4 | 3.00 | 4.00 | 3.40 |
| −1 | −1 | +1 | −1 | −1 | +1 | +1 | 3 | 3 | 3.00 | 3.00 | 3.00 |

Capacitance is calculated by adding 1 to absolute value of difference with respect to figures adjacent in left and right directions. Unit is C conversion (1 pF in this example). The reason why such calculating method is employed is that in the case where, e.g., the transition state of signal on corresponding signal line is represented by +1, the transition state of signal on the adjacent signal line is represented by +1, the capacitive coupling with the adjacent signal line is equivalent to null (or no capacitive coupling), in the case where the transition state of signal on the adjacent signal line is represented by 0, the capacitive coupling with the adjacent signal line is equal to C, and in the case where the transition state of signal on the adjacent signal line is represented by −1, the capacitive coupling with the adjacent signal line is equal to 2C. The reason why 1 is finally added is that the ground capacitance C always exists.

Now consider calculation of capacitance C2N of inverted signal wiring 2N of the second bit when, e.g., transition state of signal d1 of the first bit is +1, transition state of signal d2 of the second bit is +1, and transition state of signal d3 of the third bit is +1 (corresponding to the first row of the Table 1).

With respect to the inverted signal wiring 2N of the second bit, the capacitance between the inverted signal wiring 2N of the second bit and the non-inverted signal wiring 1P of the first bit is 2C (=C−(−C)), and the capacitance between the inverted signal wiring 2N of the second bit and the non-inverted signal wiring 2P of the second bit is 2C (=C−(−C)). Thus, because the ground capacitance is C, the entire capacitance is equal to 5C (=2C+ZC+C). Accordingly, its value is 5 in Table 1.

The delay time is calculated, in the case of single end signal, by determining the time when the signal amplitude shifts to 50% by product of resistance and capacitance. When, e.g., the capacitance is 5C, the delay time is equal to 5RC and is represented by 5.00. Unit of the delay time is RC conversion (2 ns in this example). Accordingly, 5RC is equal to 10 ns. On the other hand, the delay time of differential time is determined as follows:

$$\tau \text{ Differential} = 2R \cdot \frac{C2P \cdot C2N}{C2P + C2N} \qquad (1)$$

This equation can be solved by determining the time when the signal amplitude shifts to 50% by the time when two signals of R·C2N and R·C2P intersect with each other on the assumption that the signal waveform is linear line. Also in this case, unit of the delay time is RC conversion.

It is seen from Table 1 that the delay time is caused to undergo variations within the range from 3RC to 5RC by interference with adjacent signals. For example, in the case where the adjacent signal is in phase with the corresponding signal, there results a form such that signal propagation speed is accelerated from the adjacent signal, resulting in shortened delay time. In contrast, in the case where adjacent signal has opposite phase relationship with respect to the corresponding signal, there results a form such that signal propagation speed is decelerated from the adjacent signal, resulting in elongated delay time. Since design must be made so that the circuit correctly becomes operative even in the case where the delay time is caused to be the longest, the delay time of wiring should be considered to be 5RC (=50 n sec) which is the longest in this case. In addition, since the signal propagation time is caused to undergo interference with left and right signals so that it becomes uneven, it becomes impossible to precisely grasp the arrival time of the signal. As a result, it becomes difficult to make a design so as to satisfy the conditions of the set-up time and/or the hold time of latch at the succeeding stage.

SUMMARY OF THE INVENTION

This invention has been made in view of the above-mentioned circumstances and its object is to provide a semiconductor integrated circuit device capable of reducing delay time of wiring such as differential signal wiring or complementary signal wiring, etc.

A first aspect of a semiconductor integrated circuit device according to this invention comprises at least two sets of pairs of signal lines having first polarity and second polarity opposite thereto, the signal line of the first polarity of the signal lines of the second set being disposed at the portion adjacent to the signal line of the first polarity of the signal lines of the first set, the signal line of the second polarity of the first set being disposed at the portion adjacent to the signal line of the first polarity of the second set, the signal line of the second polarity of the second polarity being disposed at the portion adjacent to the signal line of the second polarity of the first set.

Moreover, a second aspect of the semiconductor integrated circuit device according to this invention comprises at least two sets of pairs of signal lines having first polarity and second polarity opposite thereto, the circuit device including a first signal line bundle portion in which the signal line of the first polarity of the signal lines of the second set is disposed at the portion adjacent to the signal line of the first polarity of the signal lines of the first set, the signal line of the second polarity of the first set is disposed at the portion adjacent to the signal line of the first polarity of the second set, and the signal line of the second polarity of the second set is disposed at the portion adjacent to the signal line of the second polarity of the first set, and a second signal line bundle portion in which the signal line of the first polarity of the signal lines of the second set is disposed at the portion adjacent to the signal line of the second polarity of the signal lines of the first set, the signal line of the first polarity of the first set is disposed at the portion adjacent to the signal line of the first polarity of the second set, and the signal line of the second polarity of the second set is disposed at the portion adjacent to the signal line of the first polarity of the first set, the first and second signal line bundle portions being connected to each other at least once or more by twisting the signal lines.

Further, a third aspect of the semiconductor integrated circuit device according to this invention comprises at least two sets of pairs of signal lines having first polarity and second polarity opposite thereto, the circuit device including a first signal line bundle portion in which the signal line of the first polarity of the signal lines of the second set is disposed at the portion adjacent to the signal line of the first polarity of the signal lines of the first set, the signal line of the second polarity of the first set is disposed at the portion adjacent to the signal line of the first polarity of the second set, and the signal line of the second polarity of the second set is disposed at the portion adjacent to the signal line of the second polarity of the first set, a second signal line bundle portion in which the signal line of the first polarity of the signal lines of the second set is disposed at the portion adjacent to the signal line of the second polarity of the signal lines of the first set, the signal line of the first polarity of the first set is disposed at the portion adjacent to the signal line of the first polarity of the second set, and the signal line of the second polarity of the second set is disposed at the portion adjacent to the signal line of the first polarity of the first set, a third signal line bundle portion in which the signal line of the second polarity of the signal lines of the second set is disposed at the portion adjacent to the signal line of the second polarity of the signal lines of the first set, the signal line of the first polarity of the first set is disposed at the portion adjacent to the signal line of the second polarity of the second set, and the signal line of the first polarity of the second set is disposed at the portion adjacent to the signal line of the first polarity of the first set, and a fourth signal line bundle portion in which the signal line of the second polarity of the signal lines of the second set is disposed at the portion adjacent to the signal line of the first polarity of the signal lines of the first set, the signal line of the second polarity of the first set is disposed at the portion adjacent to the signal line of the second polarity of the second set, and the signal line of the first polarity of the second set is disposed at the portion adjacent to the signal line of the second polarity of the first set, the first to fourth signal line bundle portions being connected to each other at least once or more by twisting the signal lines.

Further, a fourth aspect of the semiconductor integrated circuit device according to this invention includes a first non-inverted signal line, a second non-inverted signal line provided in associated manner at the portion adjacent to the first non-inverted signal line, a first inverted signal line provided in associated manner at the portion adjacent to the second non-inverted signal line, and a second inverted signal line provided in associated manner at the portion adjacent to the first inverted signal line.

Further, a fifth aspect of the semiconductor integrated circuit device according to this invention includes a first inverted signal line, a second non-inverted signal line provided in associated manner at the portion adjacent to the first inverted signal line, a first non-inverted signal line provided in associated manner at the portion adjacent to the second non-inverted signal line, and a second inverted signal line provided in associated manner at the portion adjacent to the first non-inverted signal line.

Moreover, a sixth aspect of the semiconductor integrated circuit device according to this invention is such that respective signal lines of the semiconductor integrated circuit device of the fourth aspect and the semiconductor integrated circuit device of the fifth aspect are connected in such a manner that the first non-inverted signal line and the first inverted signal line are crossed at a predetermined portion.

Further, a seventh aspect of the semiconductor integrated circuit device according to this invention is such that, in the semiconductor integrated circuit device of the sixth aspect, plural number of crossings are provided.

Further, an eighth aspect of the semiconductor integrated circuit device according to this invention is such that, in the semiconductor integrated circuit device of the seventh aspect, crossings are provided at equal intervals.

Further, a ninth aspect of the semiconductor integrated circuit device according to this invention includes a first wiring pair consisting of a first non-inverted signal line and a first inverted signal line in which crossings are repeated every first interval, and a second wiring pair consisting of a second non-inverted signal line and a second inverted signal line in which crossings are repeated every second interval, wherein the second non-inverted signal line or the second inverted signal line is provided in associated manner between the first non-inverted signal line and the first inverted signal line.

Further, a tenth aspect of the semiconductor integrated circuit device according to this invention is such that, in the semiconductor integrated circuit device of the ninth aspect, the first interval and the second interval are equal to each other.

In addition, an eleventh aspect of the semiconductor integrated circuit device according to this invention is such that, in the semiconductor integrated circuit device of the tenth aspect, crossing point of the second wiring pair is provided in associated manner at the middle point of the crossing points of the first wiring pair.

DESCRIPTION OF THE PREFERRED EMBODIMENTS

Figure 1:
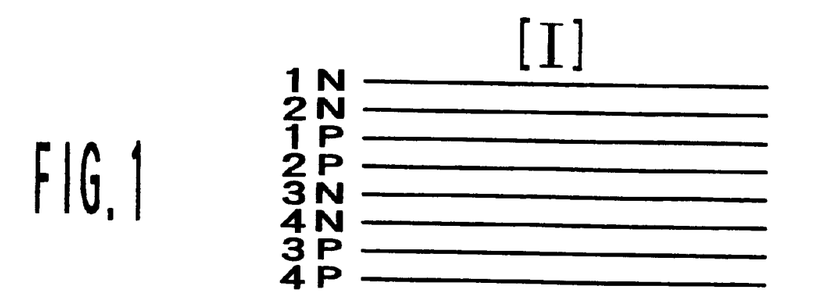
FIG. 1 is a view showing the configuration of a first embodiment of this invention.

Preferred embodiments of this invention will now be described with reference to the attached drawings. The configuration of the first embodiment of the semiconductor integrated circuit device according to this invention is shown in FIG. 1. The semiconductor integrated circuit device of this embodiment includes plural sets of pairs of signal lines for transmitting non-inverted signal and inverted signal.

When it is assumed that the first pair of signal lines are 1P, 1N, the second pair of signal lines are 2P, 2N, the third pair of signal lines are 3P, 3N, and the fourth pair of signal lines are 4P, 4N, layout is carried out in the semiconductor integrated circuit device of this embodiment such that the above-mentioned signal lines are disposed in order of 1N, 2N, 1P, 2P, 3N, 4N, 3P, 4P (see FIG. 1). This wiring layout is called pattern [I], and is represented by [I] {1N, 2N, 1P, 2P, 3N, 4N, 3P, 4P}.

The results obtained by calculating the equivalent capacitance and the delay time of wiring when capacitive coupling with adjacent wiring is taken into consideration at this time are shown in the following Table 2.

TABLE 2

| Case of Wiring Layout [I] {1N 2N 1P 2P 3N 4N 3P 4P} | | | | | | | | | | | |
|---|---|---|---|---|---|---|---|---|---|---|---|
| Adjacent Signal | | Wiring Signal at Time of Layout | | | | | Capacitance (C conversion) | | Delay Time (RC Conversion) | | |
| d1 | d3 | 1N | 2N | 1P | 2P | 3N | C2N | C2P | τ 2N | τ 2P | τ Differential |
| +1 | +1 | −1 | −1 | +1 | +1 | −1 | 3 | 3 | 3.00 | 3.00 | 3.00 |
| +1 | 0 | −1 | −1 | +1 | +1 | 0 | 3 | 2 | 3.00 | 2.00 | 2.40 |
| +1 | −1 | −1 | −1 | +1 | +1 | +1 | 3 | 1 | 3.00 | 1.00 | 1.50 |
| 0 | +1 | 0 | −1 | 0 | +1 | −1 | 3 | 4 | 3.00 | 4.00 | 3.40 |
| 0 | 0 | 0 | −1 | 0 | +1 | 0 | 3 | 3 | 3.00 | 3.00 | 3.00 |
| 0 | −1 | 0 | −1 | 0 | +1 | +1 | 3 | 2 | 3.00 | 2.00 | 2.40 |
| −1 | +1 | +1 | −1 | −1 | +1 | −1 | 3 | 5 | 3.00 | 5.00 | 3.80 |
| −1 | 0 | +1 | −1 | −1 | +1 | 0 | 3 | 4 | 3.00 | 4.00 | 3.40 |
| −1 | −1 | +1 | −1 | −1 | +1 | +1 | 3 | 3 | 3.00 | 3.00 | 3.00 |

The wiring 2N is put between the wiring 1N and the wiring 1P for complementary signals so that crosstalks of +1 and −1 are canceled. As a result, signal shifts in the state of 3RC at all times. On the other hand, since the wiring 2P is put between the wiring 1P and the wiring 3N which are not related to each other, the delay time is greatly caused to undergo variations within the range from RC to 5RC. For example, in the case where signals of both left and right wirings are in phase with signal of the wiring 2P, there results a form such that its signal propagation speed is accelerated from both adjacent signals. As a result, the delay time is caused to be the shortest. In contrast, in the case where signals of both left and right wirings have opposite phase relationship with respect to signal of the wiring 2P, there results a form such that its signal propagation speed is decelerated from the both adjacent signals. As a result, the delay time is caused to be the longest. However, the value τ2N eventually accelerates. As a result, the delay time of differential signal is caused to fall within the range from 1.50 RC to 3.80 RC. Thus, the signal propagation speed becomes higher as compared to the case of the prior art shown in FIG. 8.

Figure 2:
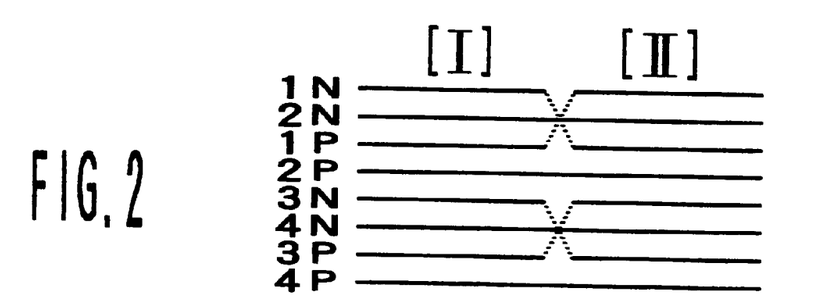
FIG. 2 is a view showing the configuration of a second embodiment of this invention.

The configuration of the second embodiment of the semiconductor integrated circuit device according to this invention is shown in FIG. 2. The semiconductor integrated circuit device of this embodiment is such that, in the semiconductor integrated circuit device of the first embodiment shown in FIG. 1, the wiring layout {1N, 2N, 1P, 2P, 3N, 4N, 3P, 4P} is twisted at the middle portion to carry out exchange between positions of wiring 1N and wiring 1P and between positions of wiring 3N and wiring 3P so that there results wiring layout {1P, 2N, 1N, 2P, 3P, 4N, 3N, 4P}. Accordingly, the wiring layout of the first half portion is the pattern [I], and the wiring layout of the latter half portion is called pattern [II] and is represented by [II] {1P, 2N, 1N, 2P, 3P, 4N, 3N, 4P}. Thus, the semiconductor integrated circuit device of this embodiment is of a form such that the pattern [I] and the pattern [II] are coupled. The layout of this embodiment is represented as follows:

Wiring layout [I] {1N, 2N, 1P, 2P, 3N, 4N, 3P, 4P}+[II] {1P, 2N, 1N, 2P, 3P, 4N, 3N, 4P}

Results obtained by calculating the equivalent capacitance and the delay time of wiring in the case where the twisting point is assumed to be just middle point of the entire length of wiring and capacitive coupling with adjacent wiring is taken into consideration are as shown in the following Table 3.

right wirings have opposite phase relationship with respect to signal of wiring 2P in the pattern [II]. Thus, there results a form such that its signal propagation speed is decelerated from both adjacent signals. At this time, sum of wiring capacitance values in total of the pattern [I] and the pattern [II] becomes equal to 6 (C/2 converted value) at all times. As a result, the entire delay time changes from 2.33 RC to 3.67 RC. Thus, variations are reduced to a greater degree as compared to the first embodiment shown in the Table 2. In addition, the delay time of differential signal changes from 2.62 RC to 3.30 RC. Thus, variations are further reduced as compared to the first embodiment shown in the Table 2.

TABLE 3

Case of Wiring Layout [I] {1N 2N 1P 2P 3N 4N 3P 4P} + [II] {1P 2N 1N 2P 3P 4N 3N 4P}

| Adjacent Signal | | Wiring Signal at Time of Layout | | | | | | | | | | Capacitance (C/2 conversion) | | | | Delay Time (RC Conversion) | | |
|---|---|---|---|---|---|---|---|---|---|---|---|---|---|---|---|---|---|---|
| | | [I] | | | | | [II] | | | | | [I] | | [II] | | | | |
| d1 | d3 | 1N | 2N | 1P | 2P | 3N | 1P | 2N | 1N | 2P | 3P | C2N | C2P | C2N | C2P | τ 2N | τ 2P | τ Differential |
| +1 | +1 | −1 | −1 | +1 | +1 | −1 | +1 | −1 | −1 | +1 | +1 | 3 | 3 | 3 | 3 | 3.00 | 3.00 | 3.00 |
| +1 | 0 | −1 | −1 | +1 | +1 | 0 | +1 | −1 | −1 | +1 | 0 | 3 | 2 | 3 | 4 | 3.00 | 3.33 | 3.16 |
| +1 | −1 | −1 | −1 | +1 | +1 | +1 | +1 | −1 | −1 | +1 | −1 | 3 | 1 | 3 | 5 | 3.00 | 3.67 | 3.30 |
| 0 | +1 | 0 | −1 | 0 | +1 | −1 | 0 | −1 | 0 | +1 | +1 | 3 | 4 | 3 | 2 | 3.00 | 2.67 | 2.83 |
| 0 | 0 | 0 | −1 | 0 | +1 | 0 | 0 | −1 | 0 | +1 | 0 | 3 | 3 | 3 | 3 | 3.00 | 3.00 | 3.00 |
| 0 | −1 | 0 | −1 | 0 | +1 | +1 | 0 | −1 | 0 | +1 | −1 | 3 | 2 | 3 | 4 | 3.00 | 3.33 | 3.16 |
| −1 | +1 | +1 | 1 | −1 | +1 | −1 | −1 | −1 | +1 | +1 | +1 | 3 | 5 | 3 | 1 | 3.00 | 2.33 | 2.62 |
| −1 | 0 | +1 | −1 | −1 | +1 | 0 | −1 | −1 | +1 | +1 | 0 | 3 | 4 | 3 | 2 | 3.00 | 2.67 | 2.83 |
| −1 | −1 | +1 | −1 | −1 | +1 | +1 | −1 | −1 | +1 | +1 | −1 | 3 | 3 | 3 | 3 | 3.00 | 3.00 | 3.00 |

Capacitance values of respective patterns become equal to values converted by C/2 because they are folded at the middle points.

The total delay time when two patterns are coupled is determined, from the delay equation of Elmore (see Neil Weste and Kamran Eshpraghian, "Principle of CMOS VLSI design", 2nd Edition, pp219, Addison Wesley), as follows:

$$\tau = \left(\frac{R}{2} \cdot \frac{C_I}{2} + R \cdot \frac{C_{II}}{2}\right) \cdot \frac{4}{3} = \frac{R}{3} \cdot (C_I + 2C_{II}) \quad (2)$$

For example, $C_I$ is equivalent capacitance of wiring when the capacitive coupling at the pattern [I] is taken into consideration, and is C/2 converted value. The reason why correction coefficient of 4/3 is multiplied is to allow the approximate result of Elmore to be equal to RC when only the ground capacitance is taken into consideration on the condition that $C_I=C_{II}=$(C/2 converted value).

The wiring 2N is put, in the case of both the pattern [I] and the pattern [II], between the wiring 1N and the wiring 1P for complementary signals so that crosstalks of +1 and −1 are canceled. As a result, signal shifts in the state of 3RC at all times. On the other hand, the wiring 2P is put, in the case of the pattern [I], between the wiring 1P and 3N which are not related to each other. In the case of the pattern [II], since the wiring 2P is put between the wiring 1N and the wiring 3P which are not related to each other, and signals of the wiring 1N and the wiring 1P and signals of the wiring 3N and the wiring 3P are respectively complementary signals, when small capacitance is attached in the pattern [I], great capacitance is attached in the pattern [II]. For example, in the case where signals of both left and right wirings are in phase with signal of the wiring 2P in the pattern [I], there results a form such that its signal propagation speed is accelerated from both adjacent signals. In that case, signals of both left and Assuming that the twisting point is k equinoctial point (0<k<1) of the entire length of wiring, when the delay time is calculated by taking into consideration the fact that $C_I+C_{II}=C_0=6$ (C/2 converted value), the delay time T is given as follows:

$$\tau = R \cdot \{k^2 C_I + (1-k)C_{II}\} \cdot \frac{4}{3} = \frac{4R}{3} \cdot \{(k^2 + k - 1)C_I + (1-k)C_0\} \quad (3)$$

From this equation, when k satisfies $k^2+k-1=0$ (k=0.618), T is equal to approximately 3.06 RC at all times and variations become equal to zero. However, in the case where wiring is bidirectional as in the case of bus, it is desirable to implement twisting at k=0.5. In addition, from a practical point of view, it is not necessarily limited that circuit connected to wiring is connected to single and uniform position. Accordingly, the optimum points of twisting positions vary every individual cases.

Figure 3:
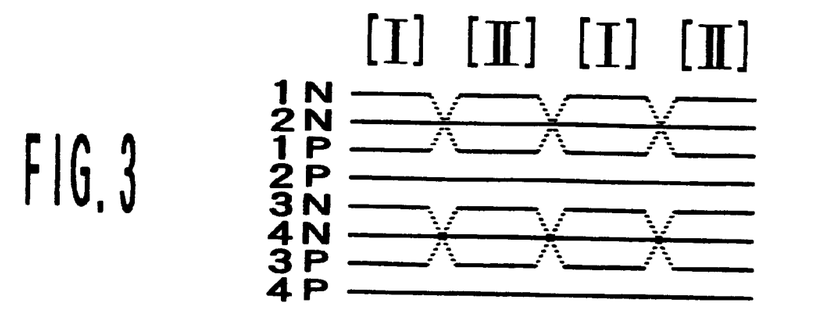
FIG. 3 is a view showing the configuration of a third embodiment of this invention.

The configuration of the third embodiment of the semiconductor integrated circuit device according to this invention is shown in FIG. 3. The semiconductor integrated circuit device of this embodiment is such that, in the semiconductor integrated circuit device of the second embodiment shown in FIG. 2, twisting operations of the wiring layout is repeated plural times, i.e., twisting operation expressed as [I]+[II]+[I]+[II]+ . . . , is carried out. Let now consider, as one example, the case where three twisting operations are carried out to repeat the pattern of [I]+[II] twice. The results obtained by calculating the equivalent capacitance and the delay time of wiring at this time are shown in the following Table 4.

TABLE 4

| Adjacent Signal | | Capacitance (C/4 Conversion) | | | | Delay Time (RC Conversion) | | |
|---|---|---|---|---|---|---|---|---|
| | | [I] | | [II] | | | | |
| d1 | d3 | C2N | C2P | C2N | C2P | τ 2N | τ 2P | τ Differential |
| +1 | +1 | 3 | 3 | 3 | 3 | 3.00 | 3.00 | 3.00 |
| +1 | 0  | 3 | 2 | 3 | 4 | 3.00 | 3.20 | 3.10 |
| +1 | −1 | 3 | 1 | 3 | 5 | 3.00 | 3.40 | 3.19 |
| 0  | +1 | 3 | 4 | 3 | 2 | 3.00 | 2.80 | 2.90 |
| 0  | 0  | 3 | 3 | 3 | 3 | 3.00 | 3.00 | 3.00 |
| 0  | −1 | 3 | 2 | 3 | 4 | 3.00 | 3.20 | 3.10 |
| −1 | +1 | 3 | 5 | 3 | 1 | 3.00 | 2.60 | 2.79 |
| −1 | 0  | 3 | 4 | 3 | 2 | 3.00 | 2.80 | 2.90 |
| −1 | −1 | 3 | 3 | 3 | 3 | 3.00 | 3.00 | 3.00 |

Capacitance values of respective patterns become equal to values converted by C/4 because folding is carried out at the quadrisected point.

The total delay time when four patterns are coupled is determined, from the delay equation of Elmore, as follows:

$$\tau = \left( \frac{R}{4} \cdot \frac{C_I}{4} + \frac{2R}{4} \cdot \frac{C_{II}}{4} + \frac{3R}{4} \cdot \frac{C_I}{4} + R \cdot \frac{C_{II}}{4} \right) \cdot \frac{8}{5} = \frac{R}{5} \cdot (2C_I + 3C_{II}) \quad (4)$$

For example, $C_I$ is equivalent capacitance of wiring in which the capacitive coupling at the pattern [I] is taken into consideration, and is C/4 converted value. The reason why correction coefficient of 8/5 is multiplied is to allow the approximate result of Elmore to be equal to RC when only the ground capacitance is taken into consideration on the condition that $C_I = C_{II} =$ (C/4 converted value).

It is seen that the delay time is further reduced when compared to the second embodiment of the Table 3.

Further, when the pattern of [I]+[II] is repeated n times and the number of twisting operations is increased to (2n−1) (number of twisting operations), the total delay time is expressed as follows:

$$\tau = \frac{R}{2n+1} \cdot \{nC_I + (n+1)C_{II}\} \quad (5)$$

From this equation, it can be understood that when $C_I$ or $C_{II}$ become uneven while satisfying the condition of $C_I + C_{II} = C_0 = 6n$ (C/2n converted vlaue), as the number of twisting operations is increased, variations of the delay time become small. It is to be noted that since resistance value of the contact portion is added to the wiring resistance every folding as described later from a practical point of view, the wiring delay is increased bit by bit accordingly.

Figure 4:
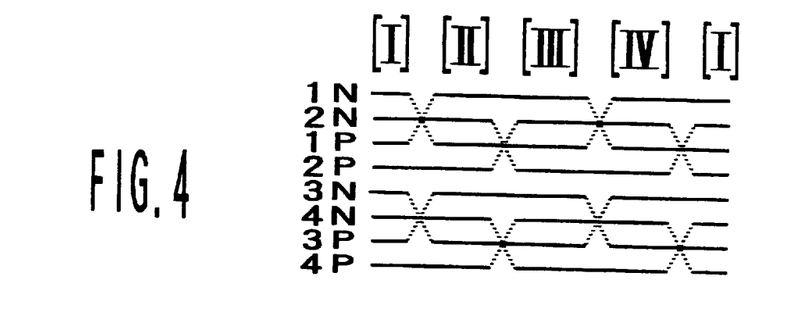
FIG. 4 is a view showing the configuration of a fourth embodiment of this invention.

The configuration of the fourth embodiment is shown in FIG. 4. This embodiment is such that the wiring layout of the second embodiment is further twisted. Initially, wiring is caused to undergo layout as indicated by {1N, 2N, 1P, 2P, 3N, 4N, 3P, 4P} to subsequently twist the wiring so that layout as indicated by {1P, 2N, 1N, 2N, 3P, 4P, 3N, 4N} is provided to subsequently twist wiring so that layout as indicated by {1P, 2P, 1N, 2N, 3P, 4P, 3N, 4N} is provided to subsequently twist wiring so that layout as indicated by {1N, 2P, 1P, 2N, 3N, 4P, 3P, 4N} is provided to finally twist the wiring so that the first (original) layout expressed as {N, 2N, 1P, 2P, 3N, 4N, 3P, 4P} results for a second time. The first wiring layout is the pattern [I], the second wiring layout is the pattern [II], the third wiring layout is called the pattern [III] and is represented by [III] {1P, 2P, 1N, 2N, 3P, 4P, 3N, 4N}, and the fourth wiring layout is called pattern [IV] and is represented by [IV] {1N, 2P, 1P, 2N, 3N, 4P, 3P, 4N}. When respective wiring layouts are assumed to be represented as above, this layout is coupling (combination) of the pattern [I], the pattern [II], the pattern [III], the pattern [IV] and the pattern [I]. This layout is represented as follows:

Wiring layout [I] {1N, 2N, 1P, 2P, 3N, 4N, 3P, 4P}+[II] {1P, 2N, 1N, 2P, 3P, 4N, 3N, 4P}+[III] {P, 2P, 1N, 2N, 3P, 4P, 3N, 4N}+[IV] {1N, 2P, 1P, 2N, 3N, 4P, 3P, 4N}+[I] {1N, 2N, 1P, 2P, 3N, 4N, 3P, 4P}

With respect to the twisting point, the points where the pattern [I] is twisted so that the pattern [II] is provided are caused to be intially the point of 1/8 of the entire length of wiring, and are caused to be successively the point of 3/8, the point of 5/8 and the point of 7/8. The results obtained by calculating the equivalent capacitance and the delay time of wiring at this time are as shown in Table 5.

TABLE 5

Case of Wiring Layout [I] {1N 2N 1P 2P 3N 4N 3P 4P} + [II] {1P 2N 1N 2P 3P 4N 3N 4P} + [III] {1P 2P 1N 2N 3P 4P 3N 4N} + [IV] {1N 2P 1P 2N 3N 4P 3P 4N} + [I] {1N 2N 1P 2P 3N 4N 3P 4P}

| Adjacent Signal | | Wiring Signal at Time of Layout | | | | | | | | | | | | | | | | | | | |
|---|---|---|---|---|---|---|---|---|---|---|---|---|---|---|---|---|---|---|---|---|---|
| | | [I] | | | | | [II] | | | | | [III] | | | | | [IV] | | | | |
| d1 | d3 | 1N | 2N | 1P | 2P | 3N | 1P | 2N | 1N | 2P | 3P | 1P | 2P | 1N | 2N | 3P | 1N | 2N | 1P | 2N | 3N |
| +1 | +1 | −1 | −1 | +1 | +1 | −1 | +1 | −1 | −1 | +1 | +1 | +1 | +1 | −1 | −1 | +1 | −1 | +1 | +1 | −1 | −1 |
| +1 | 0  | −1 | −1 | +1 | +1 | 0  | +1 | +1 | −1 | −1 | +1 | 0  | +1 | +1 | −1 | −1 | 0  | −1 | +1 | +1 | −1 | 0 |
| +1 | −1 | −1 | −1 | +1 | +1 | +1 | +1 | −1 | −1 | −1 | +1 | −1 | +1 | +1 | −1 | −1 | −1 | −1 | +1 | +1 | −1 | +1 |
| 0  | +1 | 0  | −1 | 0  | +1 | −1 | 0  | −1 | 0  | +1 | +1 | 0  | +1 | 0  | −1 | +1 | 0  | +1 | 0  | −1 | −1 |
| 0  | 0  | 0  | −1 | 0  | +1 | 0  | 0  | −1 | 0  | +1 | 0  | 0  | +1 | 0  | −1 | 0  | 0  | +1 | 0  | −1 | 0 |
| 0  | −1 | 0  | −1 | 0  | +1 | +1 | 0  | −1 | 0  | +1 | −1 | 0  | +1 | 0  | −1 | −1 | 0  | +1 | 0  | −1 | +1 |
| −1 | +1 | +1 | −1 | −1 | +1 | −1 | −1 | −1 | +1 | +1 | +1 | −1 | +1 | +1 | −1 | +1 | +1 | +1 | −1 | −1 | −1 |
| −1 | 0  | +1 | −1 | −1 | +1 | 0  | −1 | −1 | +1 | +1 | 0  | −1 | +1 | +1 | −1 | 0  | +1 | +1 | −1 | −1 | 0 |
| −1 | −1 | +1 | −1 | −1 | +1 | +1 | −1 | −1 | +1 | +1 | −1 | −1 | +1 | +1 | −1 | −1 | +1 | +1 | −1 | −1 | +1 |

| Capacitance (C/8 conversion) | Delay Time |
|---|---|

TABLE 5-continued

Case of Wiring Layout [I] {1N 2N 1P 2P 3N 4N 3P 4P} + [II] {1P 2N 1N 2P 3P 4N 3N 4P} +
[III] {1P 2P 1N 2N 3P 4P 3N 4N} + [IV] {1N 2P 1P 2N 3N 4P 3P 4N} +
[I] {1N 2N 1P 2P 3N 4N 3P 4P}

| [I] | | [II] | | [III] | | [IV] | | (RC Conversion) | | |
|---|---|---|---|---|---|---|---|---|---|---|
| C2N | C2P | C2N | C2P | C2N | C2P | C2N | C2P | τ 2N | τ 2P | τ Differential |
| 3 | 3 | 3 | 3 | 3 | 3 | 3 | 3 | 3.00 | 3.00 | 3.00 |
| 3 | 2 | 3 | 4 | 2 | 3 | 4 | 3 | 3.10 | 2.93 | 3.02 |
| 3 | 1 | 3 | 5 | 1 | 3 | 5 | 3 | 3.20 | 2.84 | 3.02 |
| 3 | 4 | 3 | 2 | 4 | 3 | 2 | 3 | 2.89 | 3.08 | 2.98 |
| 3 | 3 | 3 | 3 | 3 | 3 | 3 | 3 | 3.00 | 3.00 | 3.00 |
| 3 | 2 | 3 | 4 | 2 | 3 | 4 | 3 | 3.10 | 2.93 | 3.02 |
| 3 | 5 | 3 | 1 | 5 | 3 | 1 | 3 | 2.79 | 3.15 | 2.97 |
| 3 | 4 | 3 | 2 | 4 | 3 | 2 | 3 | 2.89 | 3.08 | 2.98 |
| 3 | 3 | 3 | 3 | 3 | 3 | 3 | 3 | 3.00 | 3.00 | 3.00 |

Capacitance values of respective patterns become equal to values converted by C/8 because folding is carried out in units of ⅛.

The total delay time when four patterns are coupled is determined, from the delay equation of Elmore, as follows.

$$\tau = \left( \frac{R}{8} \cdot \frac{C_I}{8} + \frac{3R}{8} \cdot \frac{2C_{II}}{8} + \frac{5R}{8} \cdot \frac{2C_{III}}{8} + \frac{7R}{8} \cdot \frac{2C_{IV}}{8} + R \cdot \frac{C_I}{8} \right) \cdot \frac{64}{39} \quad (6)$$

$$= \frac{R}{39} \cdot (9C_I + 6C_{II} + 10C_{III} + 14C_{IV})$$

For example, $C_I$ is equivalent capacitance of wiring when the capacitive coupling at the pattern [I] is taken into consideration. The reason why correction coefficient of 64/69 is multiplied is to allow the approximate result of Elmore to be equal to RC when only the ground capacitance is taken into consideration on the condition that $C_I=C_{II}=C_{III}=C_{IV}=1$ (C/8 converted value).

At the pattern [I] and the pattern [II], the wiring 2N is put between the wiring 1N and the wiring 1P for complementary signals so that crosstalks of +1 and −1 are canceled. On the other hand, at the pattern [III], the wiring 2N is put between the wiring 1N and the wiring 3P which are not related to each other. At the pattern [IV], the wiring 2N is put between the wiring 1P and the wiring 3N which are not related to each other. In this case, however, since signals of the wiring 1N and the wiring 1P, and signals of the wiring 3N and the wiring 3P are respectively complementary signals, when small capacitance is attached in the pattern [III], great capacitance is attached in the pattern [IV]. For example, in the case where signals of both left and right wirings are in phase with signal of the wiring 2P in the pattern [III], there results a form such that its signal propagation speed is accelerated from both adjacent signals. In that case, signals of both left and right wirings have opposite phase relationship with respect to signal of the wiring 2P in the pattern [IV], so there results a form such that its signal propagation speed is decelerated from both adjacent signals. This similarly applies to the wiring 2N. Thus, $C_I+C_{II}+C_{III}+C_{IV}=12$ (C/8 converted value) holds at all times. As a result, the entire delay time of the wiring 2N or the wiring 2P changes from 2.84 RC to 3.15 RC. In addition, the delay time of the differential signal changes from 2.97 RC to 3.02 RC. Thus, variations of the delay time are further reduced as compared to the third embodiment of Table 4.

In a manner similar to the second embodiment, if twisting is implemented at portions except for the above, similar effects can be expected.

Moreover, there may be employed an approach such that the points where the pattern [I] is twisted so that the pattern [II] is provided are caused to be first the point of ¼ of the entire length of wiring, and are caused to be successively the point of ⅔, and the point of ¾ to connect the patterns in a manner as indicated by [I]+[II]+[III]+[IV], thereby making it possible to provide similar effects.

Figure 5:
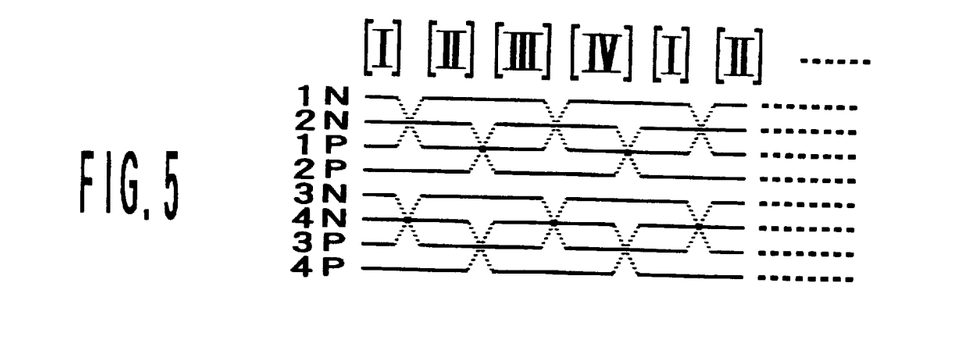
FIG. 5 is a view showing the configuration of a fifth embodiment of this invention.

Further, similarly to the third embodiment, as shown in FIG. 5, as the pattern is repeated plural times in a manner as indicated by [I]+[II]+[III]+[IV]+[I]+[II]+[III]+[IV]+ . . . to implement larger number of twisting operations, variations of the delay time are further reduced.

In the above-mentioned embodiments, even if any one of two signal lines constituting bit is caused to be non-inverted signal and the other is caused to be inverted signal, rows of other columns except for the left two columns of Tables 2 to 5 are exchanged. Accordingly, the feature expressed as $C_I+C_{II}+ \ldots =C_0$ is not changed irrespective of combination of signals. As a result, variations of the delay time are reduced in a manner stated above. For example, as the pattern [I], there are conceivable several combinations expressed as [I] {1N, 2N, 1P, 2P, 3N, 4N, 3P, 4P}, [I] {1P, 2N, 1N, 2P, 3N, 4N, 3P, 4P}, [I] {1N, 2N, 1P, 2P, 3P, 4N, 3N, 4P}, [I] {1N, 2N, 1P, 2P, 3N, 4P, 3P, 4N}, . . . , [I] {1P, 2P, 1N, 2N, 3P, 4P, 3N, 4N}. Anyway, with respect to all the cases, variations of the delay time are similarly reduced.

Moreover, even if combination is caused to begin from any one of the pattern [I], the pattern [II], the pattern [III] and the pattern [IV] to connect them in any direction, they provide similar effects.

Figure 6:
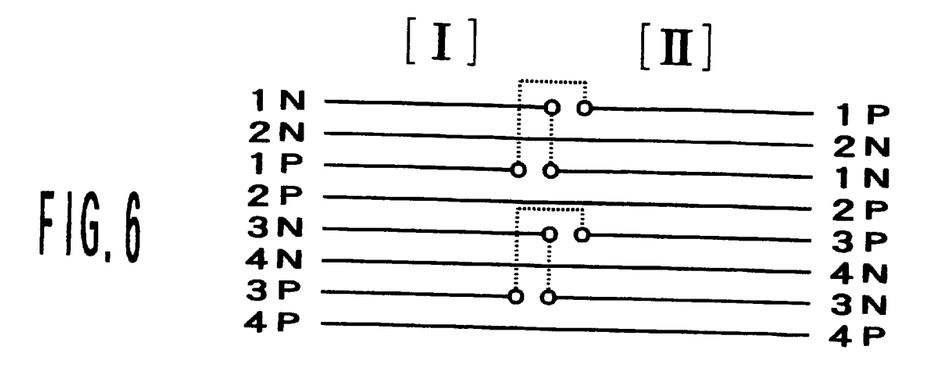
FIG. 6 shows a layout example of twisting.

Further, the layout in which wiring is twisted is shown in FIG. 6. Solid lines and broken lines indicate different wiring layers. The circular marks are contacts which connect the above-mentioned two wiring layers. For example, the solid line indicates the wiring first layer and the broken lines indicate the wiring second layer.

Figure 7:
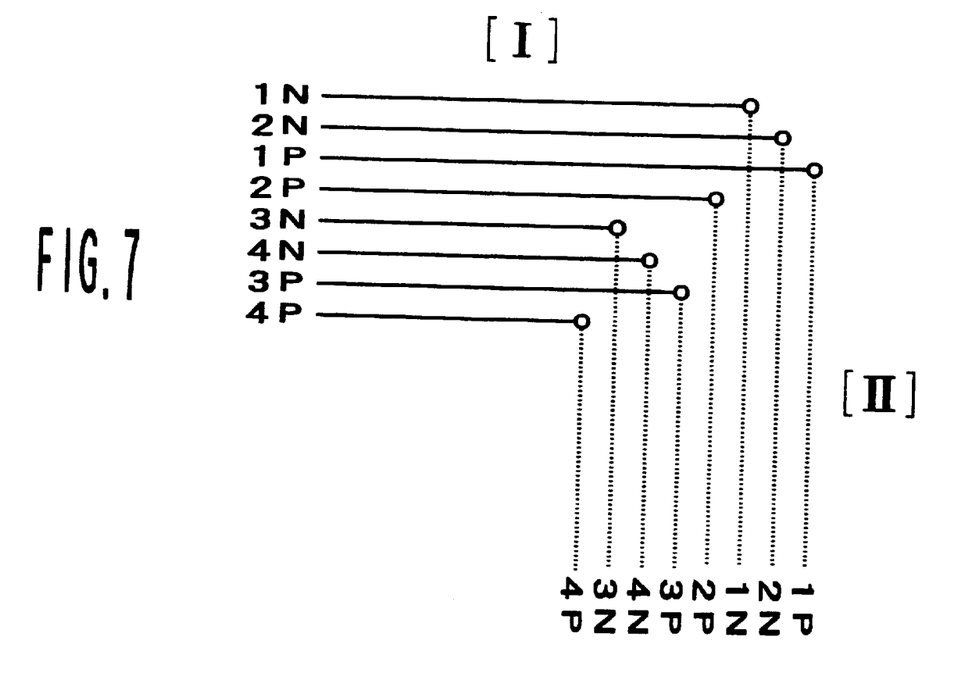
FIG. 7 shows another layout example of twisting.

Furthermore, another layout in which wiring is twisted is shown in FIG. 7.

In addition, when wirings of fixed potential like power supply potential are caused to run in parallel at both ends of the bundle of wiring which have been caused to undergo layout as stated above, signal lines do not run at the adjacent portions. Accordingly, the problem of crosstalk does not take place.

As described above, in accordance with this invention, the delay time of wiring can be shortened as far as possible.

What is claimed is:

1. A semiconductor integrated circuit device comprising at least two sets of pairs of signal lines having first polarity and second polarity opposite thereto, the semiconductor integrated circuit device further comprising a first signal line bundle portion in which the signal line of the first polarity of the signal lines of the second set is disposed at the portion adjacent to the signal line of the first polarity of the signal lines of the first set, the signal line of the second polarity of the first set is disposed at the portion adjacent to the signal line of the first polarity of the second set, and the signal line of the second polarity of the second set is disposed at the portion adjacent to the signal line of the second polarity of the first set, and a second signal line bundle portion in which the signal line of the first polarity of the signal lines of the second set is disposed at the portion adjacent to the signal line of the second polarity of the signal lines of the first set, the signal line of the first polarity of the first set is disposed at the portion adjacent to the signal line of the first polarity of the second set, and the signal line of the second polarity of the second set is disposed at the portion adjacent to the signal line of the first polarity of the first set, the first and second signal line bundle portions being connected to each other at least once or more by twisting the signal lines.

2. A semiconductor integrated circuit device comprising:

a first non-inverted signal line;

a second non-inverted signal line provided in an associated manner at a first portion adjacent to the first non-inverted signal line;

a first inverted signal line provided in an associated manner at the first portion adjacent to the second non-inverted signal line; and a second inverted signal line provided in an associated manner at the first portion adjacent to the first inverted signal line;

the second non-inverted signal line provided in an associated manner at a second portion adjacent to the first inverted signal line;

the first non-inverted signal line provided in an associated manner at the second portion adjacent to the second non-inverted signal line; and the second inverted signal line provided in an associated manner at the second portion adjacent to the first non-inverted signal line.

3. A semiconductor integrated circuit device as set forth in claim 2, wherein the first non-inverted signal line and the first inverted signal line are crossed at a predetermined portion.

4. A semiconductor integrated circuit device as set forth in claim 3, wherein the respective signal lines are crossed plural times.

5. A semiconductor integrated circuit device as set forth in claim 4, wherein the respective signal lines are crossed at equal intervals.

6. A semiconductor integrated circuit device comprising:

a first wiring pair consisting of a first non-inverted signal line and a first inverted signal line in which crossings are repeated every first interval; and a second wiring pair consisting of a second non-inverted signal line and a second inverted signal line in which crossings are repeated every second interval, wherein the second non-inverted signal line or the second inverted signal line is provided in an associated manner between the first non-inverted signal line and the first inverted signal line.

7. A semiconductor integrated circuit device as set forth in claim 6, wherein the first interval and the second interval are equal to each other.

8. A semiconductor integrated circuit device as set forth in claim 7, wherein crossing point of the second wiring pair is provided in an associated manner at the intermediate point of the crossing points of the first wiring pair.

9. A semiconductor integrated circuit device as set forth in claim 3, wherein distance between the first non-inverted signal line and the first inverted signal line, the second non-inverted signal line or the second inverted signal line, distance between the first inverted signal line and the second non-inverted signal line or the second inverted signal line, and distance between the second non-inverted signal line and the second inverted signal line are equal to each other.

10. A semiconductor integrated circuit device as set forth in claim 6, wherein distance between the first non-inverted signal line and the first inverted signal line, the second non-inverted signal line or the second inverted signal line, distance between the first inverted signal line and the second non-inverted signal line or the second inverted signal line, and distance between the second non-inverted signal line and the second inverted signal line are equal to each other.

11. A semiconductor integrated circuit device comprising at least two sets of pairs of signal lines having first polarity and second polarity opposite thereto, the semiconductor integrated circuit device further comprising a first signal line bundle portion in which the signal line of the first polarity of the signal lines of the second set is disposed at the portion adjacent to the signal line of the first polarity of the signal lines of the first set, the signal line of the second polarity of the first set is disposed at the portion adjacent to the signal line of the first polarity of the second set, and the signal line of the second polarity of the second set is disposed at the portion adjacent to the signal line of the second polarity of the first set, a second signal line bundle portion in which the signal line of the first polarity of the signal lines of the second set is disposed at the portion adjacent to the signal line of the second polarity of the signal lines of the first set, the signal line of the first polarity of the first set is disposed at the portion adjacent to the signal line of the first polarity of the second set, and the signal line of the second polarity of the second set is disposed at the portion adjacent to the signal line of the first polarity of the first set, a third signal line bundle portion in which the signal line of the second polarity of the signal lines of the second set is disposed at the portion adjacent to the signal line of the second polarity of the signal lines of the first set, the signal line of the first polarity of the first set is disposed at the portion adjacent to the signal line of the second polarity of the second set, and the signal line of the first polarity of the second set is disposed at the portion adjacent to the signal line of the first polarity of the first set, and a fourth signal line bundle portion in which the signal line of the second polarity of the signal lines of the second set is disposed at the portion adjacent to the signal line of the first polarity of the signal lines of the first set, the signal line of the second polarity of the first set is disposed at the portion adjacent to the signal line of the second polarity of the second set, and the signal line of the first polarity of the second set is disposed at the portion adjacent to the signal line of the second polarity of the first set, the first to fourth signal line bundle portions being connected to each other at least once or more by twisting the signal lines.

12. The semiconductor integrated circuit device as set forth in claim 11, wherein the first to fourth signal line bundle portions are connected to each other so that the respective twisting signal lines are crossed at equal intervals.

13. The semiconductor integrated circuit device as set forth in claim 11, wherein distance between the signal line of the first polarity of the signal lines of the first set and the signal line of the second polarity of the signal lines of the first set, the signal line of the first polarity of the signal lines of the second set, or the signal line of the second polarity of the signal lines of the second set, distance between the signal line of the second polarity of the signal lines of the first set and the signal line of the first polarity of the signal lines of the second set, or the signal line of the second polarity of the signal lines of the second set, distance the signal line of the first polarity of the signal lines of the second set and the signal line of the second polarity of the signal lines of the second set are equal to each other.

14. The semiconductor integrated circuit device as set forth in claim 11, wherein a length of the first signal line bundle portion is equal to a length of the third signal line bundle portion, and a length of the second signal line bundle portion is equal to a length of the fourth signal line bundle portion.

15. A semiconductor integrated circuit device comprising:

a first wiring pair consisting of a first non-inverted signal line and a first inverted signal line in which crossings are repeated every first interval; and a second wiring pair consisting of a second non-inverted signal line and a second inverted signal line in which crossings are repeated every second interval, wherein the second non-inverted signal line or the second inverted signal line is provided in an associated manner between the first non-inverted signal line and the first inverted signal line.

16. The semiconductor integrated circuit device as set forth in claim 15, wherein the first interval and the second interval are equal to each other.

17. The semiconductor integrated circuit device as set forth in claim 16, wherein crossing point of the second wiring pair is provided in an associated manner at the intermediate point of the crossing points of the first wiring pair.

18. The semiconductor integrated circuit device as set forth in claim 15, wherein distance between the first non-inverted signal line and the first inverted signal line, the second non-inverted signal line or the second inverted signal line, distance between the first inverted signal line and the second non-inverted signal line or the second inverted signal line, and distance between the second non-inverted signal line and the second inverted signal line are equal to each other.

* * * * *